(12) United States Patent
Rajavel et al.

(10) Patent No.: US 9,748,427 B1
(45) Date of Patent: Aug. 29, 2017

(54) MWIR PHOTODETECTOR WITH COMPOUND BARRIER WITH P-N JUNCTION

(71) Applicant: HRL Laboratories, LLC, Malibu, CA (US)

(72) Inventors: Rajesh D Rajavel, Oak Park, CA (US); Hasan Sharifi, Agoura Hills, CA (US); Terence J De Lyon, Newbury Park, CA (US); Pierre-Yves Delaunay, Santa Monica, CA (US); Brett Z Nosho, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/069,232

(22) Filed: Oct. 31, 2013

Related U.S. Application Data

(60) Provisional application No. 61/721,315, filed on Nov. 1, 2012.

(51) Int. Cl.
*H01L 31/103* (2006.01)
*H01L 31/101* (2006.01)
(Continued)

(52) U.S. Cl.
CPC .................................. *H01L 31/102* (2013.01)

(58) Field of Classification Search
CPC . H01L 31/101; H01L 31/0352; H01L 31/103; H01L 31/03046; H01L 31/035236; H01L 27/14649; H01L 31/102; H01L 31/105; H01L 31/02327; H01L 31/035218; H01L 31/109; H01L 31/028; H01L 31/18; H01L 31/14607; H01L 31/0304; H01L 31/09; H01L 31/022408; H01L 31/035209; H01L 31/184; H01L 31/02161; H01L 31/02162; H01L 31/03044; H01L 31/1461; H01L 31/14638; H01L 31/0687; H01L 31/03042; H01L 31/0288; H01L 31/03048; H01L 31/06; H01L 31/062; H01L 31/068; H01L 31/072; H01L 31/076; H01L 31/1032; H01L 31/12; H01L 31/14; H01L 31/147; H01L 31/153; H01L 27/14694; H01L 27/14634; H01L 27/14643; H01L 27/1446; H01L 27/1468; H01L 27/14625; H01L 27/14665; H01L 27/14669; H01L 27/305; H01L 27/146; H01L 33/06;
(Continued)

(56) References Cited

U.S. PATENT DOCUMENTS 4,158,577 A * 6/1979 Milnes .................. H01L 31/078
136/249
6,285,697 B1 * 9/2001 Landwehr et al. .... B82Y 20/00
372/45.01
(Continued)

*Primary Examiner* — Julia Slutsker
*Assistant Examiner* — Natalia Gondarenko
(74) *Attorney, Agent, or Firm* — George R. Rapacki; Albert T. Wu

(57) ABSTRACT

The invention describes a device which enables MWIR photodetectors to operate at zero bias and deliver low dark current performance. The performance is achieved by incorporating a p-n junction in the barrier. The device consists of a p-type contact layer, a p-n junction in the compound barrier (CB) with graded composition and/or doping profiles, and an n-type absorber (p-CB-n) device.

19 Claims, 22 Drawing Sheets

(51) Int. Cl.
*H01L 27/144* (2006.01)
*H01L 31/102* (2006.01)
*H01L 31/02* (2006.01)
*H01L 31/00* (2006.01)
*H01L 27/146* (2006.01)

(58) Field of Classification Search
CPC ......... H01L 33/04; H01L 33/18; H01L 33/24; H01L 21/02466; H01L 21/02549; H01L 21/02398; H01L 2251/308; H01L 2224/11; H01L 31/1844; H01L 31/03529; H01L 31/0725; H01L 27/14607; H01L 27/1461; H01L 27/14638; H01L 27/307
USPC ... 257/461, 188, E31.058, E21.002, 21, 184, 257/431, 432, 441, E31.033, E31.093, 257/E31.127, E31.003, E21.294; 438/57, 438/69, 73
See application file for complete search history.

(56) References Cited

U.S. PATENT DOCUMENTS

| | | | |
|---|---|---|---|
| 7,053,293 B2 * | 5/2006 | Uppal | 136/253 |
| 7,368,762 B2 * | 5/2008 | Tennant et al. | 257/184 |
| 8,299,497 B1 * | 10/2012 | Klem et al. | H01L 31/101 257/184 |
| 2007/0235758 A1 * | 10/2007 | Klipstein | H01L 31/101 257/188 |
| 2009/0041407 A1 * | 2/2009 | Silfvenius | B82Y 20/00 385/14 |
| 2009/0224229 A1 * | 9/2009 | Razeghi | H01L 31/0304 257/21 |
| 2009/0256231 A1 * | 10/2009 | Klipstein | 257/441 |
| 2010/0230720 A1 * | 9/2010 | Wicks | 257/188 |
| 2010/0301309 A1 * | 12/2010 | Tennant et al. | 257/21 |
| 2011/0049566 A1 * | 3/2011 | Perera et al. | 257/185 |
| 2013/0020666 A1 * | 1/2013 | Smith | 257/432 |

\* cited by examiner

| Layer | Structure/Materials | Nominal Thickness (nm) | Doping Level (cm-3) |
|---|---|---|---|
| p+ Contact | InAs$_{0.8}$Sb$_{0.2}$ | 100 | 5.0e+17 |
| Barrier 2 | Al$_{0.95}$Ga$_{0.05}$Sb | 150 | 1.0E16 P-Type |
| Barrier 1 | Al$_{0.95}$Ga$_{0.05}$Sb | 100 | 1.0E16 N-Type |
| n- Absorber | InAs$_{0.8}$Sb$_{0.2}$ | 3000 | 1.0E+15 |
| Graded Layer | InAs$_{0.8}$Sb$_{0.2}$ | 50 | 5E17 to 1E15 |
| n+ Contact | InAs$_{0.8}$Sb$_{0.2}$ | 500 | 5.0E17 |
| Substrate | GaAs and buffer layer | varies | N/A |

Fig. 10.

| Design | Layer | Material | Thickness | Doping |
|---|---|---|---|---|
| #1 | Contact (n-type) | InAs | .01 μm | n=1e18 |
| | Barrier 2 (n-type doping) | InAs/GaInSb/AlGaInSb-based 'W' superlattice * | 0.5 μm | n graded 1e16-1e18 |
| | Barrier 1 (p-type doping) | InAs/GaInSb/AlGaInSb-based 'W' superlattice * | 0.5 μm | p=1e16 |
| | p-Absorber | 9 ML InAs / 7 ML GaSb | 5 μm | p=1e16 |
| | doping grade | 5 ML InAs / 10 ML GaSb | 0.2 μm | p graded 1e18-1e16 |
| | Wide bandgap electron barrier / Contact | GaSb | | p=1e18 |
| | Substrate | GaSb | 2 μm | n or p |
| #2 | Contact (p-type) | GaSb | .01 μm | p=1e18 |
| | Barrier 2 (p-type doping) | 4 ML InAs / 7 ML GaSb | 0.5 μm | p graded 1e16-1e18 |
| | Barrier 1 (n-type doping) | 4 ML InAs / 7 ML GaSb | 0.5 μm | n=1e16 |
| | n-Absorber | 9 ML InAs / 7 ML GaSb | 5 μm | n=1e16 |
| | doping grade | InAs/GaInSb/AlGaInSb-based 'W' superlattice * | 0.2 μm | n graded 1e18-1e16 |
| | Wide bandgap hole barrier / Contact | InAs/GaInSb/AlGaInSb-based 'W' superlattice * | 2 μm | n=1e18 |
| | Substrate | GaSb | | n or p |

* See E. H. Aifer, J. G. Tischler, J. H. Warner, I. Vurgaftman, W. W. Bewley, J. R. Meyer, J. C. Kim, and L. J. Whitman, Applied Physics Letters, 89, 053519 (2006) for examples of 'W' superlattice

Fig. 13.

| Layer | Structure / Materials | Nominal thickness (nm) | Bandgap (eV) at 150K | Doping level(cm$^{-3}$) |
|---|---|---|---|---|
| p+ Contact | InAs/InAs$_{0.62}$Sb$_{0.38}$ 4.0 nm/1.5 nm | 100 | 0.24 | 5E+17 |
| p- Barrier | Al$_{0.85}$Ga$_{0.05}$Sb or AlAs$_{0.075}$Sb$_{0.925}$ | 100 | 2.2 2.4 | 1E15 to 1E16 |
| n- Barrier | Al$_{0.85}$Ga$_{0.05}$Sb or AlAs$_{0.075}$Sb$_{0.925}$ | 150 | 2.2 2.4 | 1E15 to 1E16 |
| n- Absorber | InAs/InAs$_{0.62}$Sb$_{0.38}$ 4.0 nm/1.5 nm | 3000 to 6000 | 0.24 | 1E15 to 1E16 |
| Graded layer | InAs/InAs$_{0.62}$Sb$_{0.38}$ 4.0 nm/1.5 nm | 50 | 0.24 | 5E17 to 1E16 |
| n+ Contact | InAs/InAs$_{0.62}$Sb$_{0.38}$ 4.0 nm/1.5 nm | 500 | 0.24 | 5E+17 |

Fig. 14.

Basic device

| Layer | Structure / Materials | Nominal thickness (nm) | Bandgap (eV) at 150K | Doping level(cm$^{-3}$) |
|---|---|---|---|---|
| p+ Contact | InAs$_{0.78}$Sb$_{0.22}$ | 100 | 0.24 | 5E+17 |
| p- Barrier | Al$_{0.15}$Ga$_{0.85}$Sb or AlAs$_{0.075}$Sb$_{0.925}$ | 100 | 2.2 2.4 | 1E15 to 1E16 |
| b- Barrier | Al$_{0.15}$Ga$_{0.85}$Sb or AlAs$_{0.075}$Sb$_{0.925}$ | 150 | 2.2 2.4 | 1E15 to 1E16 |
| a- Absorber | InAs$_{0.78}$Sb$_{0.22}$ | 3000 to 6000 | 0.24 | 1E15 to 1E16 |
| Graded layer | InAs$_{0.78}$Sb$_{0.22}$ | 50 | 0.24 | 5E17 to 1E16 |
| n+ Contact | InAs$_{0.78}$Sb$_{0.22}$ | 500 | 0.24 | 5E+17 |

Optimal design

| Layer | Structure / Materials | Nominal thickness (nm) | Bandgap (eV) at 150K | Doping level (cm$^{-3}$) |
|---|---|---|---|---|
| p+ Contact | Al$_{0.1}$In$_{0.2}$As$_{0.42}$Sb$_{0.57}$ or InAs$_{0.78}$Sb$_{0.22}$ | 50 to 100 | 0.78 0.24 | 1E+18 |
| Graded layer | Chirped superlattice or graded alloy between contact and barrier3 | 50 to 200 | variable | 1E16 to 1E16 |
| p- Barrier3 | Al$_{0.1}$In$_{0.2}$As$_{0.42}$Sb$_{0.57}$ | 50 to 100 | 0.78 | 1E15 to 1E16 |
| p- Barrier2 | Al$_{0.15}$Ga$_{0.85}$Sb or AlAs$_{0.075}$Sb$_{0.925}$ | 150 | 2.2 2.4 | 1E15 to 1E16 |
| n- Barrier1 | Al$_{0.15}$Ga$_{0.85}$Sb or AlAs$_{0.075}$Sb$_{0.925}$ | 150 | 2.2 2.4 | 1E15 to 1E16 |
| a- Absorber | InAs$_{0.78}$Sb$_{0.22}$ | 3000 to 6000 | 0.24 | 1E15 to 1E16 |
| Graded layer | Chirped superlattice or graded alloy between hole reflector and absorber | 50 to 200 | 0.68 to 0.24 | 1E18 to 1E16 |
| n+ Wide bandgap hole reflector | Al$_{0.32}$In$_{0.25}$As$_{0.5}$Sb$_{0.5}$ | 50 to 200 | 0.68 | 1E+18 |

Fig. 15.

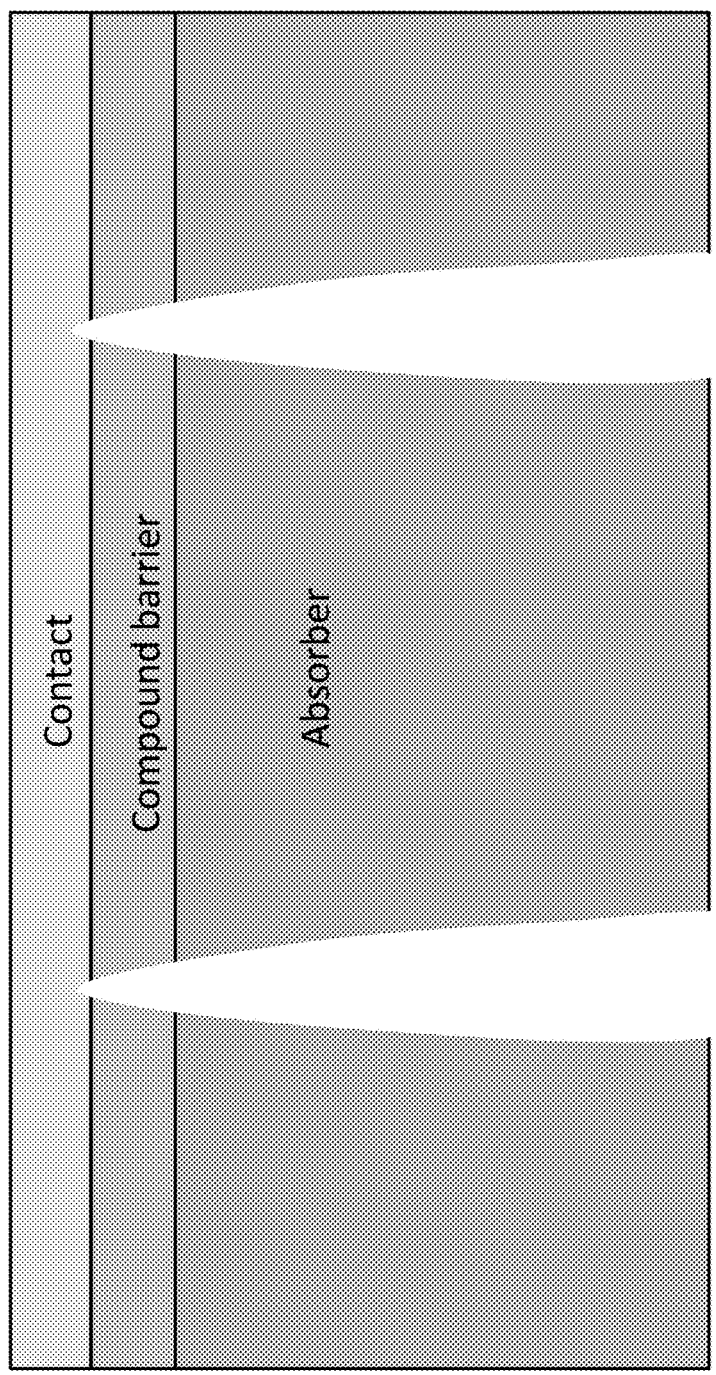

MWIR PHOTODETECTOR WITH COMPOUND BARRIER WITH P-N JUNCTION

RELATED APPLICATIONS

This application claims priority to provisional application 61/721,315 filed Nov. 1, 2012 the content of which is incorporated by reference herein.

STATEMENT REGARDING FEDERALLY SPONSORED RESEARCH OR DEVELOPMENT

This invention was made with Government support under Contract No. W15P7T-06-D-E402/0071 (sub contract# S09-102166, task order #05) awarded by the US Army through CACI. The Government has certain rights in the invention.

FIELD OF THE INVENTION

The present technology relates to an apparatus and method for improving the performance of an infrared photodetector.

BACKGROUND OF THE INVENTION

An infrared photodetector for use as a focal plane array can comprise a "barrier" layer, whose composition is specifically chosen to produce a near-zero band offset for the minority carries, but serves to block the majority carriers. Prior-art devices rely upon undoped or uniformly doped bandgap AlSb-based alloys in the barrier layer, which are difficult to controllably dope, leading to detector turn-on voltage issues, and spillage of the electric field into the narrow-bandgap absorber region of the detector structure resulting in increased generation-recombination (G-R) dark current Devices can be designed to achieve lower dark current and desired operating characteristics through judicious device design. In addition, low voltage operation of barrier-based detectors is desired for two reasons: 1) compatibility with the Read Out Integrated Circuit (ROIC) drive voltage needed to turn-on the diode, which is typically less than 500 mV, and 2) to ensure that barriers (for the majority carriers) that have been introduced to minimize dark current do not block the transport of minority carriers; inadvertently introduced minority carrier barriers can adversely affect the quantum efficiency at a given bias. An operating bias (the bias at which the photo-response reaches the near maximum value) of zero volts indicates that the device is free of such minority carrier barrier. This represents the ideal alignment of the energy bands between the absorber, barrier and the contact layer. Hence zero-bias operation verifies absence of undesirable minority carrier barriers. Additionally it is desired to achieve the lowest dark current at the operating bias while suppressing any quantum efficiency losses.

An example prior art photodetector "High Operating Temperature XBn-InAsSb Bariode Detectors", Philip Klipstein, Olga Klin, Steve Grossman, Noam Snapi, Inna Lukomsky, Michael Yassen, Daniel Aronov, Eyal Berkowitz, Alex Glozman, Osnat Magen, Itay Shtrichman, Rami Frenkel and Eliezer Weiss, Quantum Sensing and Nanophotonic Devices IX, edited by Manijeh Razeghi, Eric Tournie, Gail J. Brown, Proc. of SPIE Vol. 8268, 82680U•© 2012 SPIE recommends doping the absorber layer the same as the barrier layer, contrary to the principles of the present invention.

U.S. Pat. No. 8,004,012 to Klipstein, U.S. Pat. Nos. 7,795,640, and 7,687,871 to Maimon teach an absorber layer doped the same type as the barrier layer.

One consequence of doping the absorber layer the same as barrier layer for the prior art devices is that they exhibit variability in the bias needed to operate, and potential increase in the detector dark current due to the electric field spilling into the absorber.

FIG. 1A shows the band diagram for the structure diagram in FIG. 1B. The background doping from the Molecular Beam Epitaxy (MBE) or metallorganic chemical vapor deposition (MOCVD) system results in the formation of a hole-barrier (102) in a device with a not-intentionally doped barrier (101); the barrier has an n-type background conductivity. The barrier to hole transport (102) reduces the quantum efficiency (QE) of the detector.

FIG. 2 shows the energy band diagram of a prior art photodetector and the effect of various bias voltages and background doping. The background doping of the epitaxial growth system (MBE or MOCVD) can result in the formation of a hole-barrier 201 in the valence band (and 102 region in FIG. 1A) in a device with a not-intentionally doped barrier. This results in the following disadvantage: 1) large turn on voltages >400 mV to undo the barrier (207 curve) which approaches the limits of a ROIC's capability, and can diminish the quantum efficiency (QE) of the device, and 2) spilling of the electric field (due to the large applied bias) into the absorber which increases the G-R dark current (see FIG. 4 for details).

FIG. 3A shows the energy band diagram and FIG. 3B shows the corresponding structure of a prior art photodetectors with counter doping of the barrier (i.e. doped p-type). Counter doping of the barrier p-type reduces the hole barrier to about 100 mV, as a result of the band misalignment between the absorber and the n+ contact layer. However, the bias needed to surmount the 100 mV barrier results in the field spilling into the absorber as shown in FIG. 4.

FIG. 4 shows the energy band diagram of a prior art infrared photodetector of FIG. 3B with a doped p-type barrier and illustrating the spill over of the electric field in the absorber region when biased to overcome the hole barrier in the conduction band. The bias needed to undo the small (~100 mV) barrier results in the spilling of the electric field into the absorber (region 401) which increases the G-R dark current.

The problems described with respect to the prior art are at least partially solved by the embodiments according to the principles of the present invention herein.

SUMMARY OF THE INVENTION

The principles of the present invention are embodied in a p-n junction barrier infrared photodetector comprising: a photo absorber layer responsive to infrared light, a barrier layer disposed on the absorber layer, the barrier layers comprising a p-n junction formed of a suitably doped first barrier layer (disposed on the absorber layer) and a suitably doped second barrier layer with the opposite doping type as the first barrier layer, and a contact layer disposed on the second barrier layer. The contact layer having the same doping type as the second barrier. The barrier layers may comprise substantially of $Al_y In_{1-y} As_x Sb_{1-x}$, where y is between 0.25 and 1, and x is between, 0.75 and 0. Alternatively, the barrier layer can comprise substantially of $Al_y Ga_{1-y} As_x Sb_{1-x}$, where y is between 0.5 and 1, x is between, 0 and 0.5.

The previously described embodiment of a compound barrier infrared photodetector may further comprise barrier layers doped to a concentration between 5.0E14 and 5.0E17 per cm$^3$. The first barrier layer may be doped n-type and the second barrier layer may be doped p-type. The first and second barrier layers can have different compositions. Additionally, the first and second barrier layers may be graded in composition. The absorber is doped n-type and the contact layer is doped p-type. This device can be referred to as a p-CB-n device, where p stands for the doping type of the contact, CB stands for the compound barrier and n stands for the doping type of the absorber.

In an alternative embodiment, the previously described compound barrier infrared photodetector may have the second barrier layer doped p-type at a concentration of 1.0E14 to 1.0E18 per cm$^3$. The first barrier layer may be undoped to retain its residual n-type conductivity.

In an alternative embodiment, the compound barrier infrared photodetector can be an n-CB-p device which includes an n-type contact to collect the minority carriers, a compound barrier (CB) that consists of a p-n junction with the n region of the barrier adjacent the n-type contact, and an absorber that is doped p-type.

In an alternative embodiment, the previously described compound barrier infrared photodetectors may have one barrier layer doped p-type at a concentration of 1.0E14 to 1.0E18 per cm$^3$. Similarly the other barrier layer may be doped 1.0E14 to 1.0E18, n-type.

In an alternative embodiment, the previously described compound barrier infrared photodetectors may have one barrier layer doped p-type at a concentration of 1.0E14 to 1.0E18 per cm$^3$. The other barrier layer may be undoped to retain its residual n-type conductivity.

In an alternative embodiment, the previously described compound barrier infrared photodetectors may have one barrier layer doped n-type at a concentration of 1.0E14 to 1.0E18 per cm$^3$. The other barrier layer may be undoped to retain its residual p-type conductivity.

In an alternative embodiment the compound barrier infrared photodetector may comprise: an absorber layer responsive to infrared light, a barrier layer disposed on the absorber layer, a contact layer disposed on the barrier layer. The absorber may comprise a III-V semiconductor alloy selected from the AlGaInNPAsSb family of semiconducting alloys. Moreover, the barrier layer has a bandgap less than about 2 electron-volts and at least a portion of the barrier is doped p-type to a concentration between 1.0E14 and 1.0E18 cm-3.

In an alternative embodiment, a compound barrier infrared photodetector may comprise: a photo absorber layer responsive to infrared light, a first barrier layer disposed on the absorber layer, a second barrier layer disposed on the first barrier layer, and a contact layer disposed on the second barrier layer. The first and second barrier layers may have different compositions.

The barrier layers may comprise substantially $Al_yIn_{1-y}As_xSb_{1-x}$, where y is between 0.25 and 1, and x is between, 0.75 and 0. Alternatively, the barrier layers may comprise substantially $Al_yGa_{1-y}As_xSb_{1-x}$, where y is between 0.5 and 1, x is between, 0.5 and 0.

The first barrier layer and the second barrier layer are doped of opposite types. The first barrier layer and the absorber layer are doped the same type. The second barrier and the contact layer that facilitates the collection of minority carriers have the same doping type.

In an alternative embodiment, a compound barrier infrared photodetector comprising: an absorber layer responsive to infrared light, a first barrier layer disposed on the absorber layer, a second barrier layer disposed on the first barrier layer, a contact layer disposed on the second barrier layer in a first region, wherein the first barrier layer and the second barrier layer are each selected to allow minority carrier transport across the two barriers. Moreover, the first barrier layer comprises a III-V semiconductor alloy selected from the AlGaInNPAsSb family of semiconducting alloys.

In an alternative embodiment, a compound barrier infrared photodetector may comprise: a photo absorber layer responsive to infrared light, a first barrier layer of a first semiconductor material disposed on the absorber layer, a second barrier layer of a second semiconductor material disposed on the first barrier layer, a third barrier layer of a third semiconductor material disposed on the second barrier layer, a contact layer disposed on the third barrier layer. The third semiconductor material may comprise an aluminum alloy with aluminum fraction less than 80%. The third barrier layer may comprise $Al_{0.7}In_{0.3}As_{0.4}Sb_{0.6}$. The third barrier layer thickness may be 5 to 50 nm. The first barrier has the same doping type as the absorber layer. The second and third barrier layers may have the opposite doping type as the first barrier, and the third barrier layer may have the same doping type as the contact layer. The first, second and third barriers may be graded in composition and doping level.

Alternatively, the first barrier may have the same doping type as the absorber layer, the first and second barrier layers may have the opposite doping type as the third barrier layer, and the third barrier layer may have the same doping type as the contact layer.

In an alternative embodiment, a compound barrier infrared photodetector may comprise: a photo absorber layer responsive to infrared light, a first barrier layer disposed on the absorber layer, a second barrier layer disposed on the first barrier layer, a third barrier layer disposed on the second barrier layer, a contact layer disposed on the third barrier layer. The absorber layer, the first barrier layer, the second barrier layer, the third barrier layer and the contact layer may comprise semiconductor alloys whose constituents are selected from the (AlGaIn)(NPAsSb) family of semiconducting alloys. The absorber can be an alloy of $InAs_{1-x}Sb_x$ (x=0 to 0.25) or alternately a superlattice consisting substantially of InAs/GaSb or InAs/InGaSb or alternatively a superlattice consisting substantially of $InAs/InAs_{1-x}Sb_x$ alloys suitable for the detection of midwave infrared radiation. Lattice matching is desirable, but not necessary for the realization of the barrier-based detectors.

BRIEF DESCRIPTION OF THE DRAWINGS

The accompanying drawings, together with the specification, illustrate exemplary embodiments of the present invention, and, together with the description, serve to explain the principles of the present invention.

FIG. 10 shows a table detailing the composition and structure of an infrared photodetector according to the principles of the present invention.

FIG. 13 shows exemplary compositions for an InAs/GaSb superlattice-based detector that incorporates a p-n junction in the barrier. The general structure diagram of the detector is shown in FIG. 7.

FIG. 14 shows exemplary compositions for an InAs/InAsSb superlattice detector that incorporates a p-n junction in the barrier and zero turn-on voltage characteristics.

FIG. 15 shows exemplary compositions for an InAsSb-based detector that incorporates a p-n junction in the barrier and zero turn-on voltage characteristics.

FIG. 16e shows pixel isolation obtained by etching the absorber layer, the entire barrier as well as partial reticulation of the contact layer.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the principles of the present invention. Accordingly, the drawings and description are to be regarded as illustrative in nature, and not restrictive.

The problems described in the Background section are at least partially solved by the principles of the present invention, including, by using a barrier layer structure comprising a p-n junction and including a contact layer whose doping type is opposite to that of the absorber layer.

The principles of the present invention disclose a p-CB-n (or alternatively n-CB-p based device) based device which exhibits broad photodetector response at a bias of zero volts (i.e. zero volt turn-on), has minimal barriers that can impede the flow of minority carriers, and hence represents appropriate band alignment necessary for the collection of photo-generated minority carriers. In contrast to the principles of the present invention, prior art barrier based mid wave infrared (MWIR) photodetectors reported in the literature have turn-on voltages of ~100 to 700 mV due to the presence of one or more barriers. The presence of multiple barriers can compromise the quantum efficiency performance of the device. From Molecular Beam Epitaxy (MBE) growth and Focal Plane Array (FPA) performance reproducibility standpoints, it is desirable to utilize a design that offers zero turn-on voltage. Zero turn-on voltage enables one to quickly track performance drifts from the expected baseline performance. One embodiment according to the principles of the present invention achieves this by doping the contact p-type which facilitates unimpeded flow of holes from the n-type absorber to the contact.

The principles of the present invention results in two fundamental device design attributes: doping the contact p-type for an n-type absorber and introducing a p-n junction in the barrier.

While the embodiments according to the principles of the present invention are described in the context of MWIR devices, the principles of the present invention are applicable to Short Wave Infrared (SWIR) and Long Wave Infrared (LWIR) photodetectors as well.

Figure 1A:
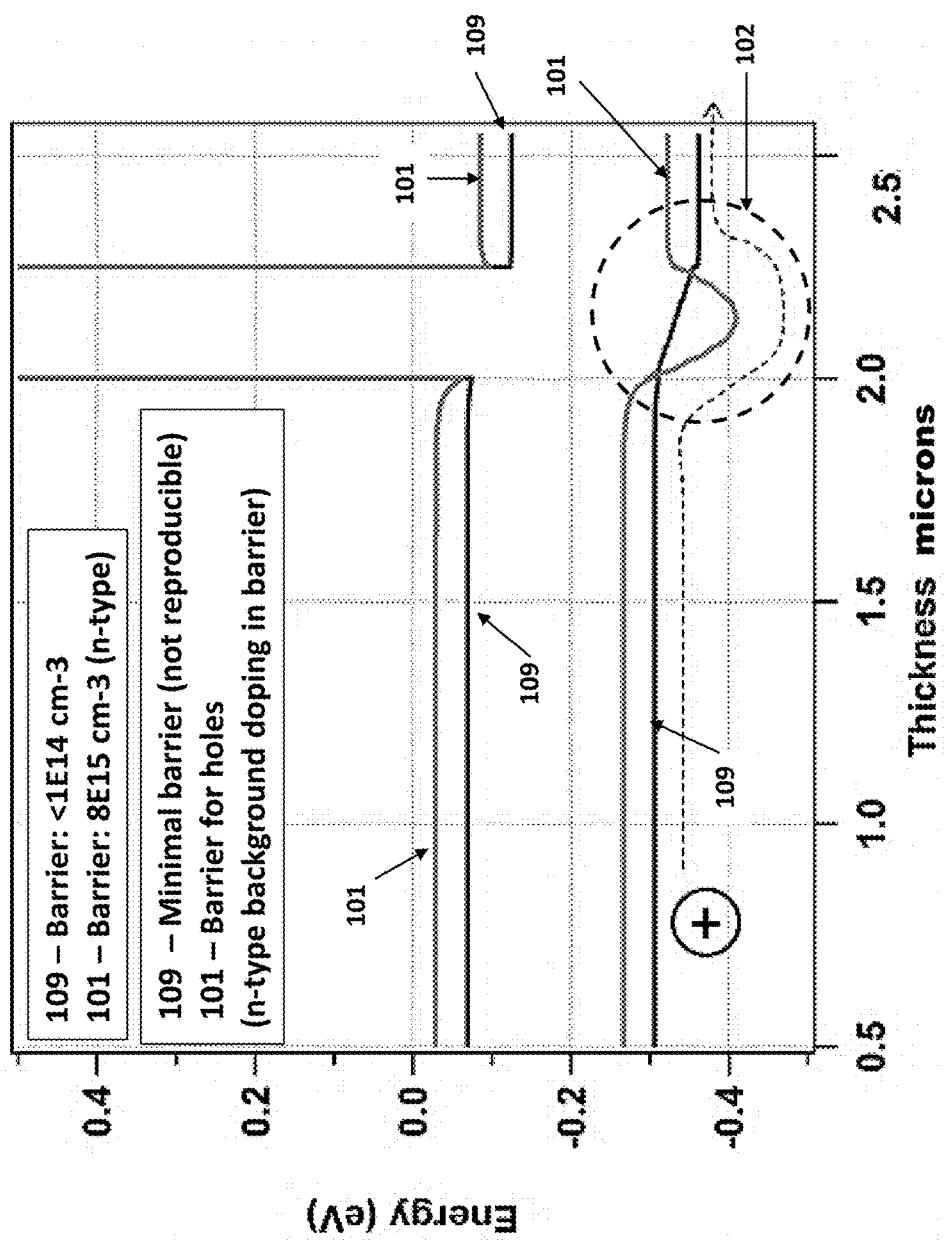
FIG. 1A shows the band diagram of a prior art infrared photodetector element shown in FIG. 1B of a focal plane array.
Figure 1B:
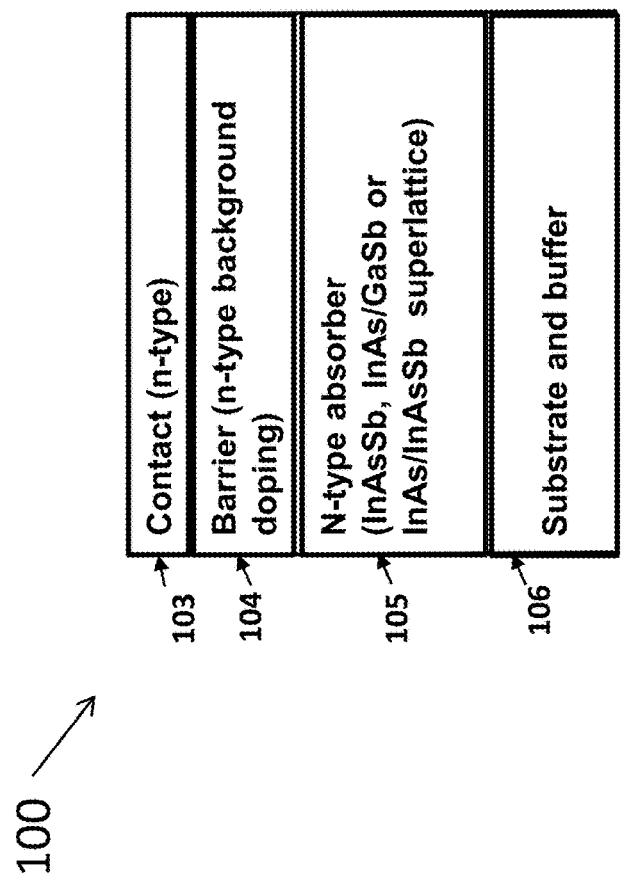
FIG. 1B shows the structure of a prior art photodetector with a band diagram as shown in FIG. 1A.

Prior-art designs of "nBn" photodetectors are based on a structure shown in FIG. 1B. The device 100 consists of three distinct layers: an "Absorber" layer 105 in which photo-generation of minority carriers occurs due to absorption of incoming photons, a "Barrier" layer 104 that blocks the flow of majority carriers, and a "Contact" layer 103 that facilitates collection of minority carriers and connection to a metal contact layer to complete an external circuit.

Figure 2:
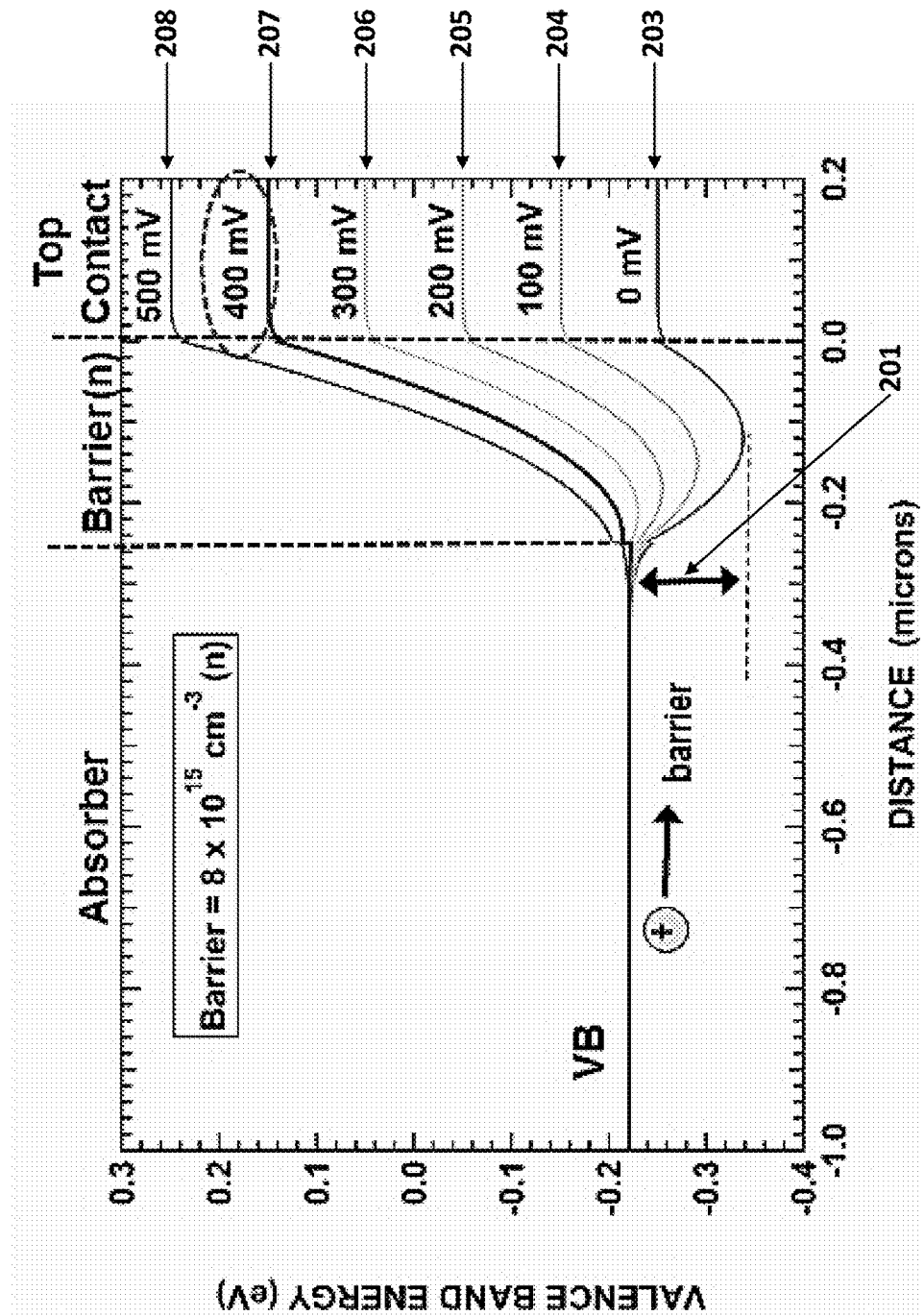
FIG. 2 shows the energy band diagram of a prior art photodetector and the effect of various bias voltages and background doping.
Figures 3A, 3B:
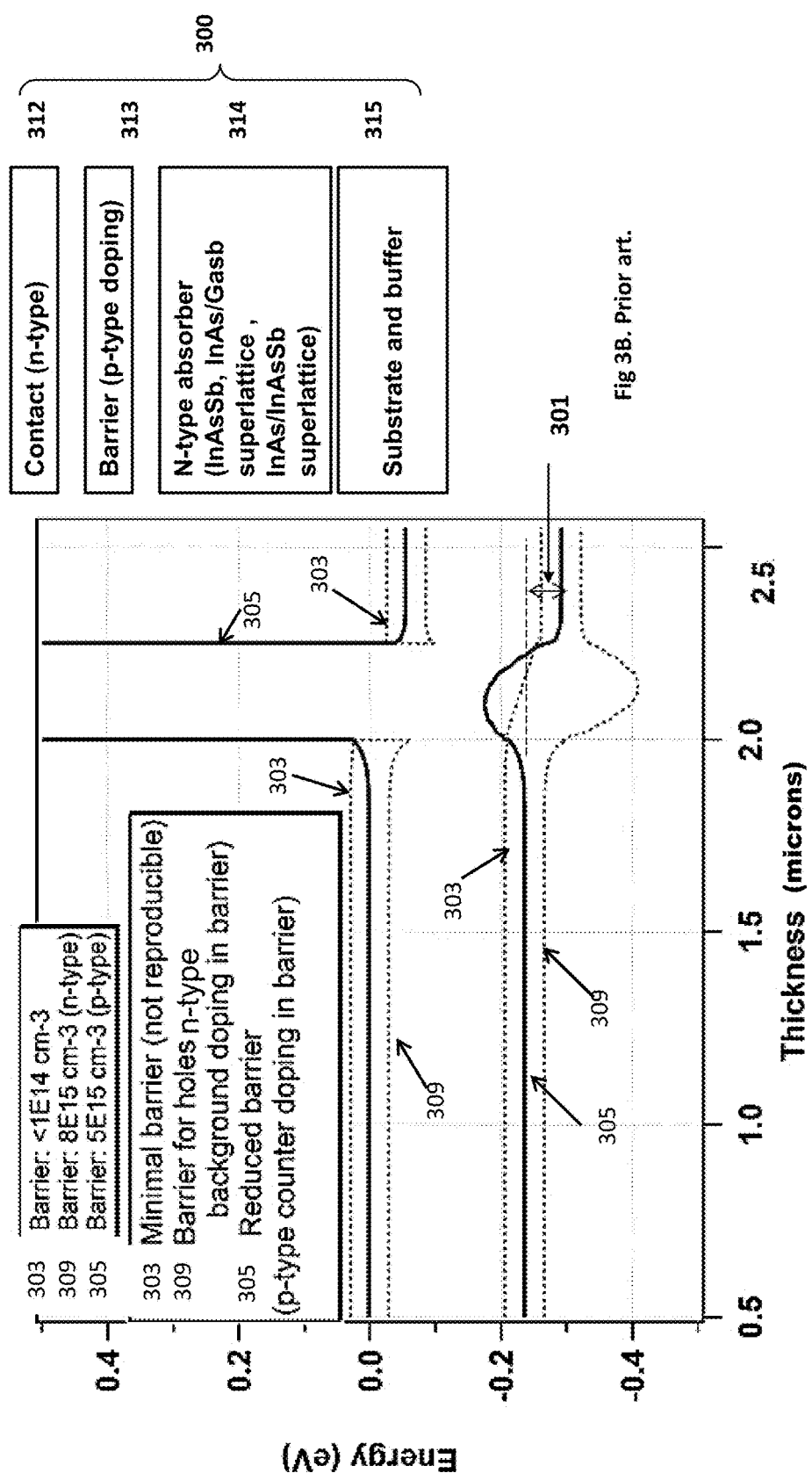
FIG. 3A shows the energy band diagram of a prior art photodetectors with counter doping of the barrier (i.e. doped p-type); ie barrier layer doping opposite to that of the absorber layer.
FIG. 3B shows the structure of a prior art photodetectors of FIG. 3A with counter doping of the barrier (i.e. doped p-type) with the absorber layer doped n-type.
Figure 4:
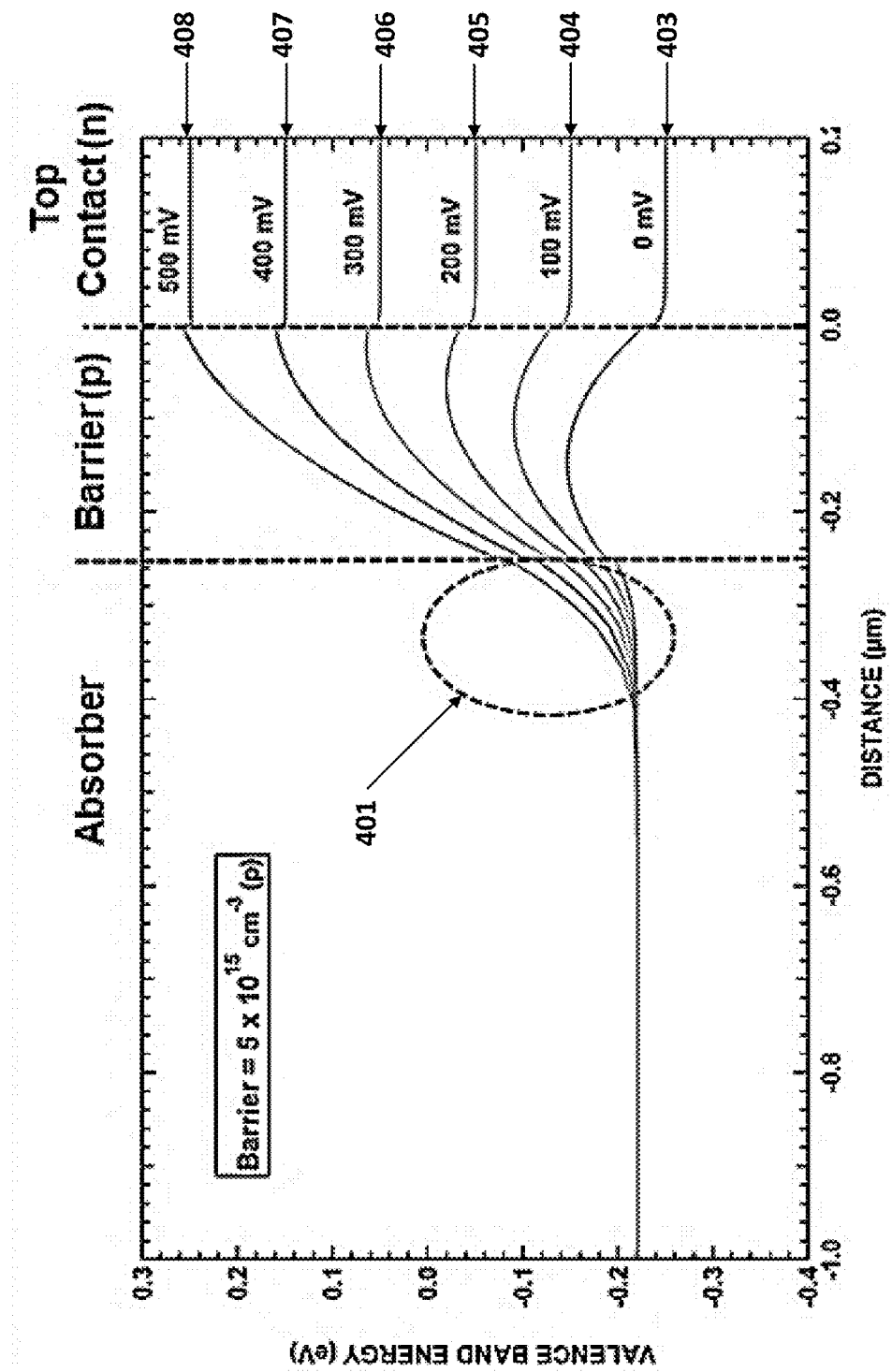
FIG. 4 shows the energy band diagram of a prior art infrared photodetector with background doping of the barrier layer; barrier layer doped p-type.

The primary characteristic to the design in FIG. 1B is that the combination of materials for the absorber layer 105 and barrier layer 104 are specifically chosen to provide valence band (bottom portion of curve 109 in FIG. 1A) alignment resulting in about a 100 mV turn-on voltage for an ideal device structure with about $1 \times 10^{14}$ cm$^{-3}$ background doping level in the barrier layer 104. A typical semiconducting material combination that meets this requirement, for instance, is InAs$_{0.91}$Sb$_{0.09}$/AlAs$_{0.09}$Sb$_{0.91}$. This prior-art design is not optimized to minimize the turn-on voltage which is susceptible to the background doping level in the barrier, which imposes a unintentional barrier for minority carriers (bottom portion of curve 101 in FIG. 1A). Additionally, this prior-art design is not optimized to minimize the band bending in the absorber and the associated G-R current. FIG. 2 shows the valence band energy level when a bias voltage is applied to remove the unintentional barrier. The resultant band bending in the absorber layer 105 leads to generation-recombination current (G-R) due to the presence of defect states in the semiconductor bandgap. Variability in the epitaxial growth system causes difficulty in precisely controlling the electrical properties of the barrier layer 104 due to changes in the background doping level.

By way of example and not limitation, the following embodiments are particularly suited for detecting light in the 0.5 micron to 20 micron wavelengths. Different material combinations will allow other wavelengths of light to be detected.

Figure 5A:
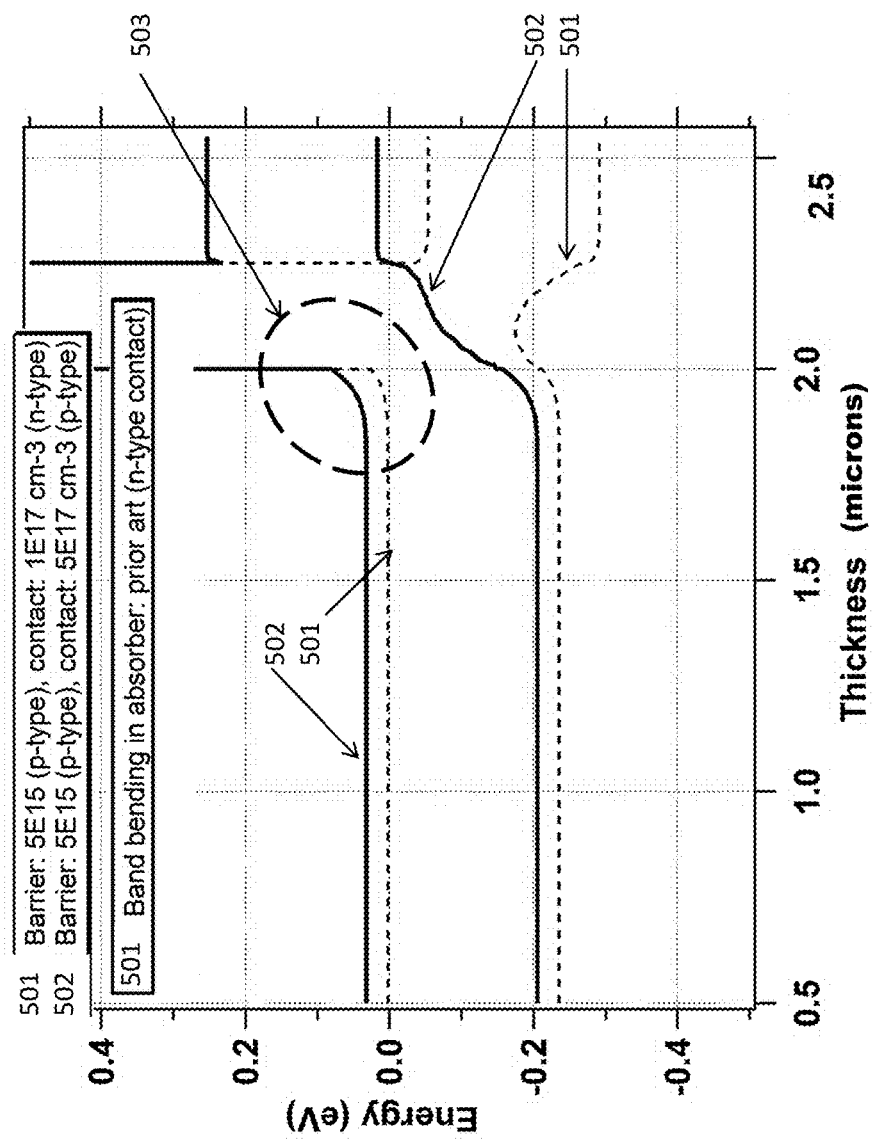
FIG. 5A shows the energy band diagram of an infrared photodetector with a doped contact as well as a doped barrier layer.
Figure 5B:
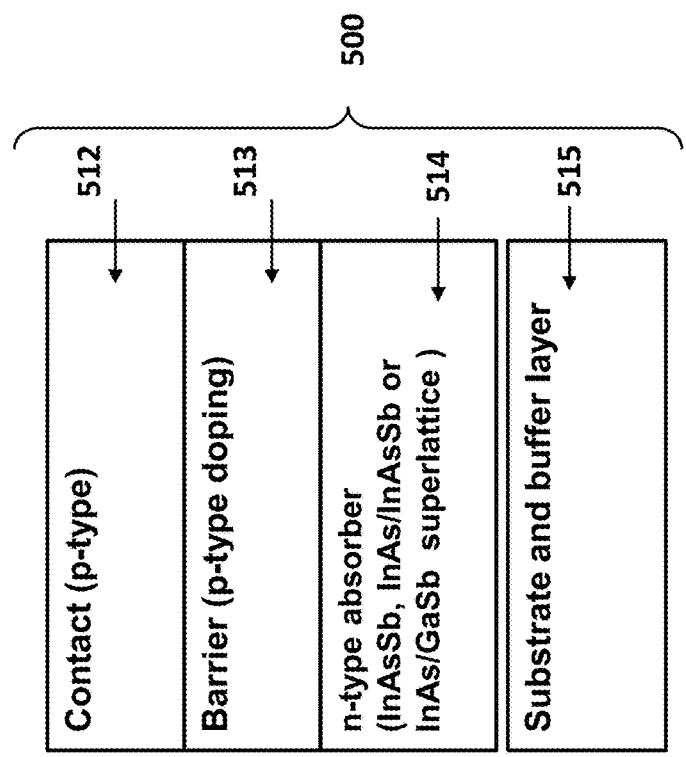
FIG. 5B shows the structure diagram of a device 500 with p-type doping of the barrier 513 together with a p-type contact layer 512. The band diagram (502) of this device is shown in FIG. 5A

FIG. 5A shows the energy band diagram of a prior art infrared photodetector with a doped contact as well as a doped barrier layer with the resulting band bending in the valence band of the absorber (lower curve 501). In contrast, band diagram 502 of a device with p-type doping of the barrier 513 (device 500 in FIG. 5B) together with p-type doping of the contact layer 512 results in the elevation of the conduction and valence band energy levels of the contact layer when compared to a conventional device with an n-type contact layer (501 curve). This results in a barrier free transport of holes resulting in the collection of holes in the contact layer without the application of a voltage. This device structure shown in 500 (FIG. 5B) thus exhibits zero-volt turn-on characteristics. A potential drawback of this device is the band bending 503 in the absorber layer (i.e. depletion of the n-type absorber) in the vicinity of the absorber/barrier interface. Band bending 503 in the absorber results in increased G-R current. Reducing the p-type doping level (501) in the barrier 513 from 5E15 cm$^{-3}$ to 1E15 cm$^{-3}$, for example, can reduce the extent of band bending in the absorber 514. However, predictable adjustment of the barrier doping at such low levels is difficult or at least impractical owing to the residual background conductivity. If the background doping level in the barrier 513 is n-type, it may be necessary to dope the barrier layer 513 p-type (counter doping) to realize net p-type conductivity. This design may not result in reproducible detector dark current performance. It is thus desirable to engineer a design that is 1) relatively insensitive to the background doping level in the barrier 513 and 2) minimizes the extent of band bending 503 in the absorber 514 to provide the lowest reproducible dark current performance. Typical doping levels for the barrier layer 513 are 5E15 to 5E16 cm$^3$ while the contact layer 512 is doped 5E17 cm$^3$.

Continuing with FIG. 5A. One consequence of the p-type doping of the barrier 513 together with p-type doping of the contact layer 512 is the elevation of the contact layer conduction and valence bands with respect to the Fermi level (represented by the 0 eV energy level)

Figure 6:
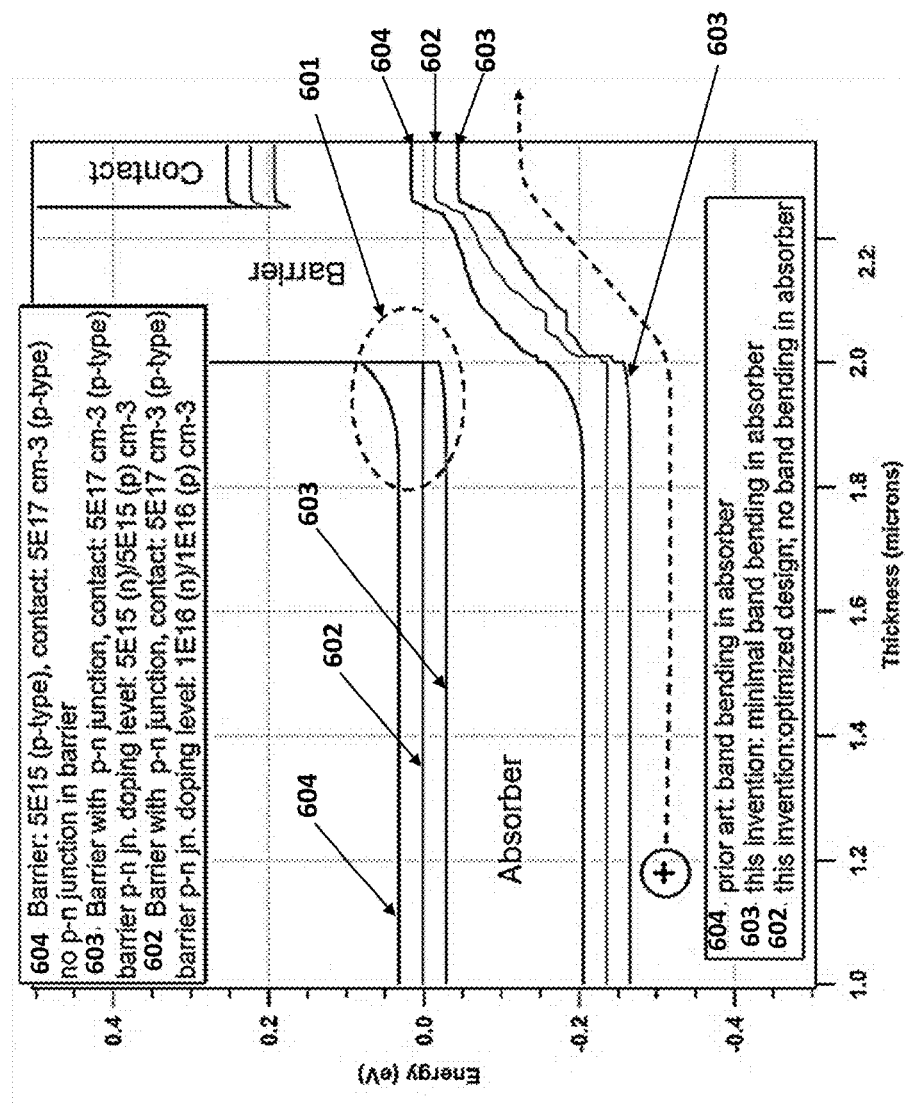
FIG. 6 shows the energy band diagram of a compound barrier infrared photodetector according to the principles of the present invention.
Figure 7:
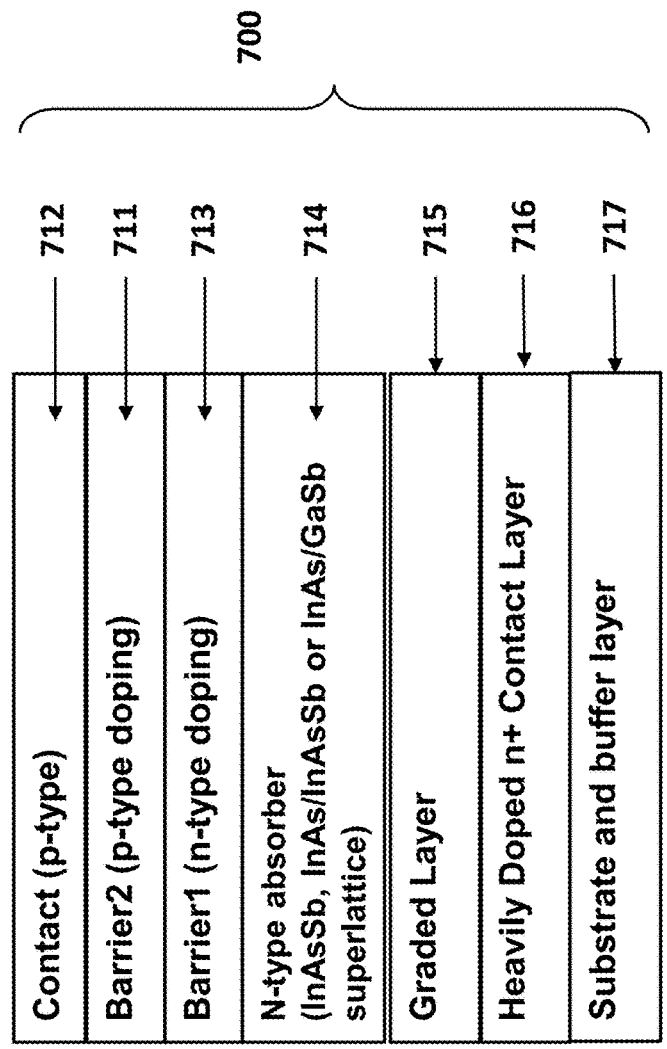
FIG. 7 shows an exemplary structure diagram of a compound barrier infrared photodetector of FIG. 6 according to the principles of the present invention.

FIG. 6 shows the energy band diagram of a compound barrier infrared photodetector 700 in FIG. 7 according to the principles of the present invention. To provide zero-volt turn on characteristics, and concurrently minimize band bending in the absorber we introduce a p-n junction in the barrier, and dope the contact such that its doping type is opposite that of the absorber. The compound barrier, which consists of barrier 713 (n-type doped) and barrier 711 (p-type doped) minimizes band bending of the absorber. Placing the p-n junction in the wide bandgap barrier confines band bending within the barrier. Besides the opposite doping types, barrier 711 and barrier 713 can also have different compositions. Moreover, the device 700 in FIG. 7 may have a contact layer 712 doped p-type. The dotted ellipse (601) illustrates that the band bending for the 603 and 602 curves (represents the design with the p-n junction in the barrier) is reduced significantly as compared to that for the 604 curve (represents prior art design with barrier which is doped p-type only). Reduced band bending in the absorber results in reduced generation-recombination (G-R) dark current.

Typical materials for the barrier layers 711/713 are AlAs$_x$Sb$_{1-x}$, AlGa$_x$Sb$_{1-x}$ or an alloy consisting substantially of AlInAsSb or AlGaAsSb with barrier layer 711 doped p-type and barrier layer 713 doped n-type. Preferred doping levels range between 1E14 and 1E17. Doping materials, by way of example and not limitation, may be beryllium, carbon, silicon or tellurium.

In an alternative embodiment, the contact layer 712 may be doped p-type to a concentration substantially between 1.0E16 and 1.0E19 per cm$^3$. Doping materials, by way of example and not limitation, may be beryllium or carbon.

The thicknesses of the barrier layers 711/713 may be between 50 nm to 400 nm with 150 nm preferred for the barrier layer 711 and 100 nm for the barrier layer 713 in one embodiment.

Figure 8:
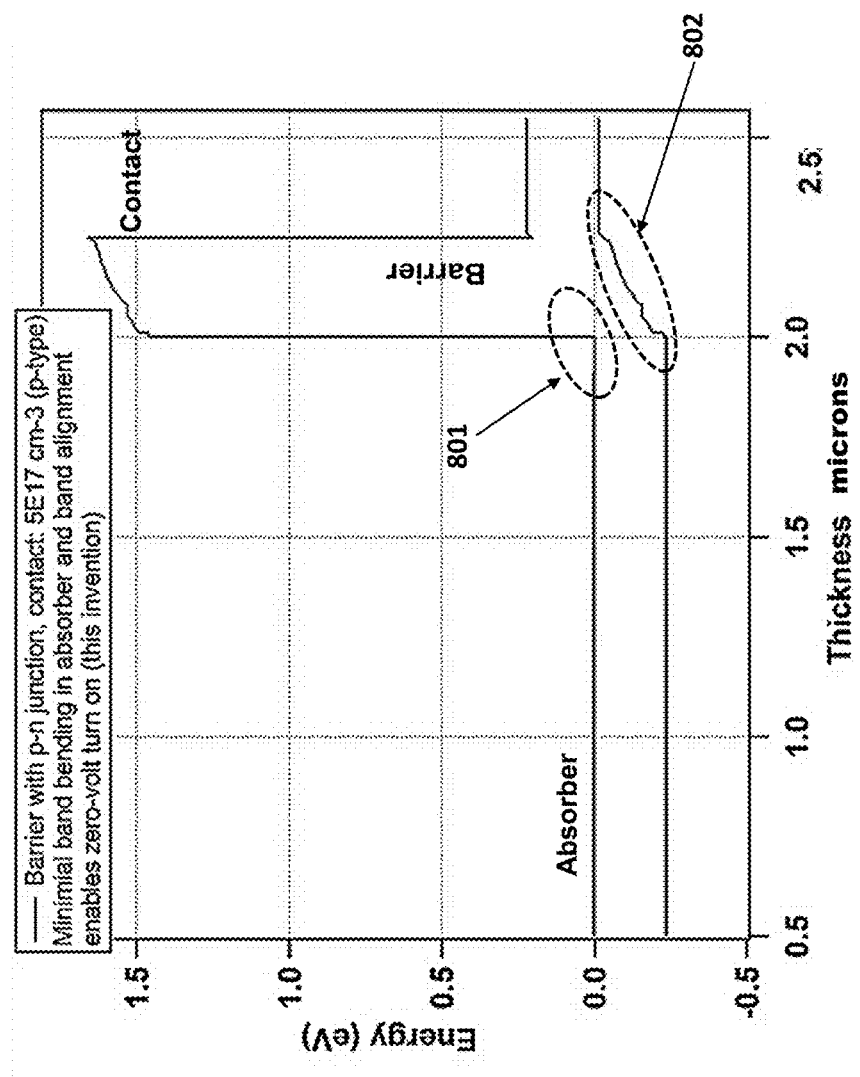
FIG. 8 shows an energy band diagram of an infrared photodetector according to the principles of the present invention.

FIG. 8 shows the band diagram of a p-Cb-n infrared photodetector 700 whose structure diagram is shown in FIG. 7. The device design provides: 1) minimal band bending (801) in the absorber and 2) barrier free (802) transport of holes, for zero-volt turn-on characteristics This device uses a p-type contact layer 712, a compound barrier 711/713 that includes a p-n junction, and an n-type absorber 714. The absorber 714 in the vicinity of the absorber/barrier interface (region 801) shows negligible band bending. Additionally, the valence band energy level through the barrier layer 802 shows the absence of a barrier to minority carrier transport. The remaining layers of device 700 are a graded layer 715 that acts as an interface between the absorber layer 714 and a heavily doped contact layer 716. The heavily doped contact layer 716 is disposed on a substrate 717 with a buffer layer between the heavily doped contact layer 716 and the substrate 717. Validation of zero-volt turn on characteristics for devices with the p-type contact 712, as illustrated in FIG. 7, was performed by fabricating InAsSb detectors and comparing them to devices with an n-type contact layer.

Figure 9:
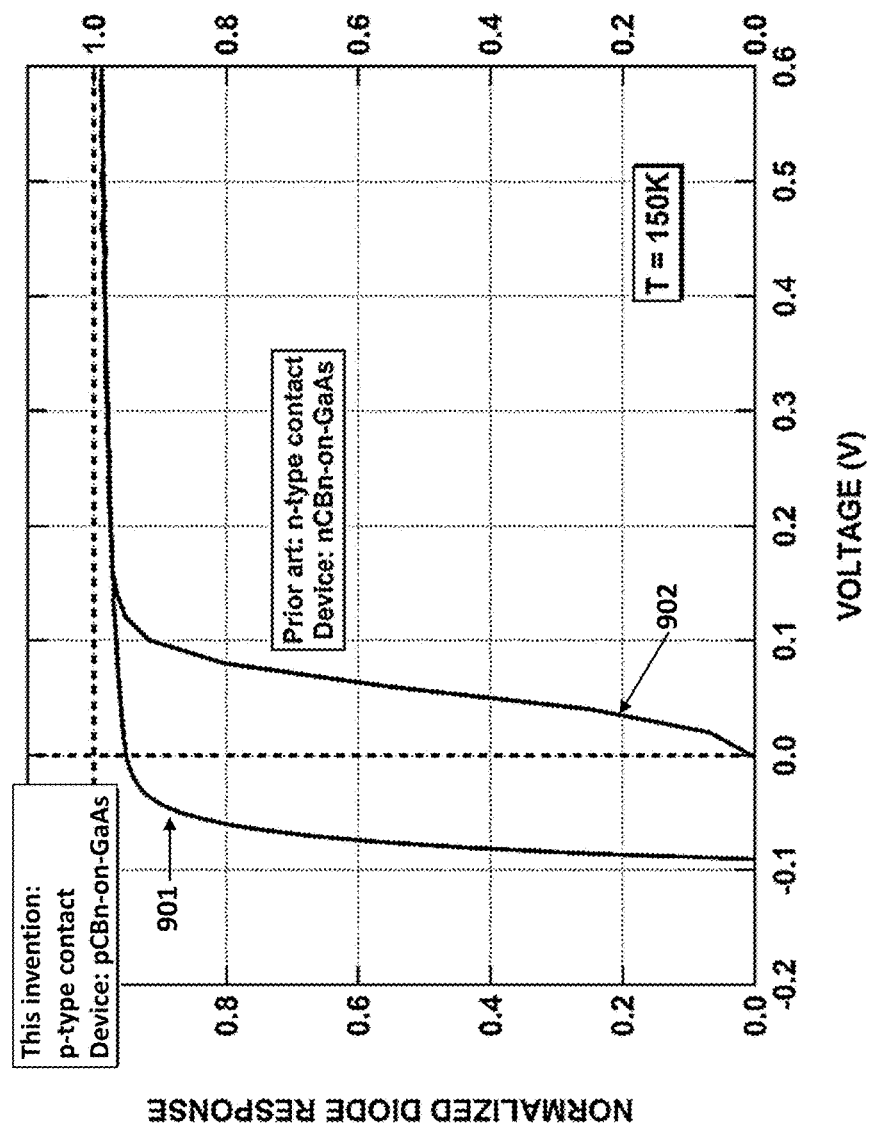
FIG. 9 shows the experimentally measured current versus voltage characteristics for a prior art infrared photodetector 902 compared to an infrared photodetector according to the principles of the present invention 901.

FIG. 9 shows the experimentally measured current versus voltage characteristics for a prior art infrared photodetector 902 compared to that of an infrared photodetector 700 (curve 901) according to the principles of the present invention. Turn-on characteristics of a conventional barrier device (902) and that with the p-type contact layer (901, run #Sb12-012) are illustrated. The zero-volt turn on characteristic was verified for the device which utilized a p-type contact layer.

As shown in FIG. 9, the device 700 with the p-type contact layer (per the principles of this invention, 901 curve) exhibits near-maximum spectral response (i.e. near-maximum quantum efficiency) at zero volt, as compared to that for a device with an n-type contact (902 curve) which requires a reverse bias with a magnitude of 150 mV.

FIG. 10 shows a table detailing the composition and structure of an infrared photodetector according to the principles of the present invention. This p-CB-n device provides zero turn-on voltage operation. Exemplary current-voltage performance is as shown in FIG. 11.

The structure diagram of the p-CB-n device according to the principles of the present invention that provides zero-turn on voltage operation is shown in FIG. 10. The substrate can include a buffer layer. For simplicity, the barrier in this prototype embodiment was undoped to take advantage of the residual doping that provides for near-ideal band alignment of the barrier and the absorber to demonstrate zero-volt turn-on characteristics. As previously described, the barrier can consist of n- and p-regions to minimize any electric field from spilling into the absorber to achieve the lowest dark current performance.

Figure 11:
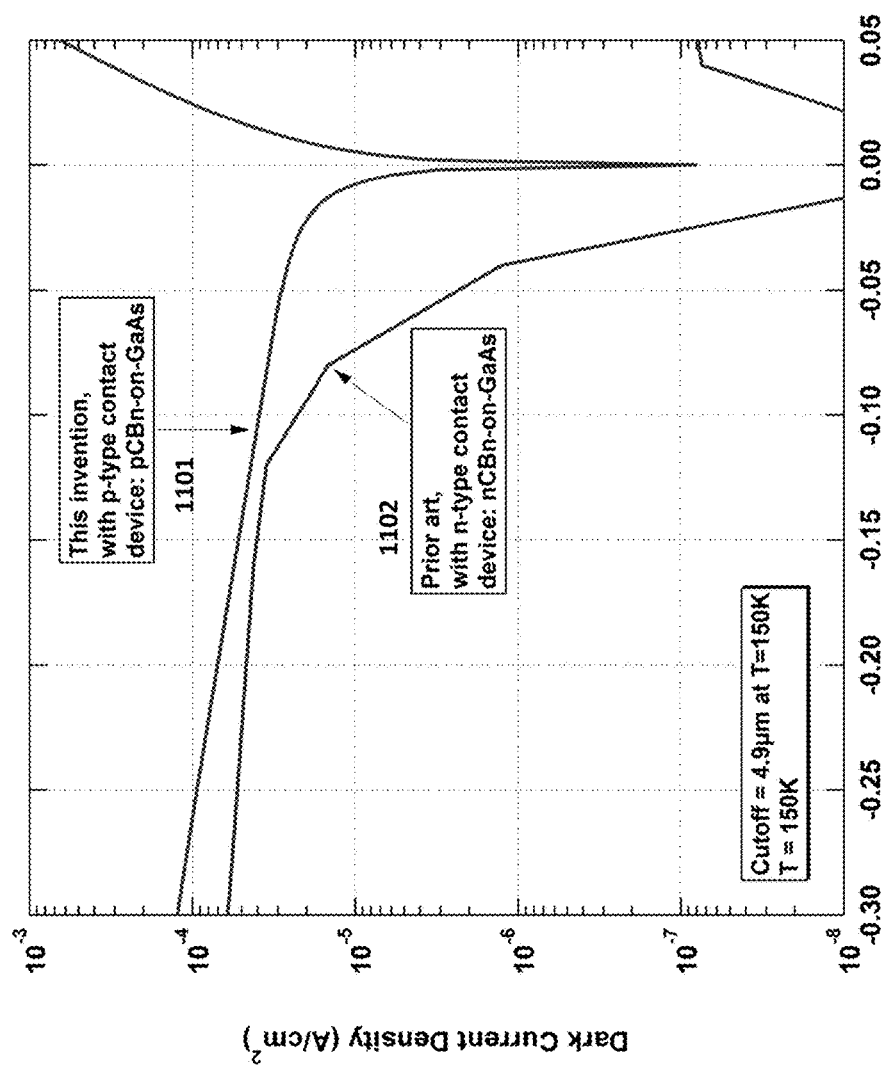
FIG. 11 illustrates the current vs. voltage characteristics of a prior art infrared photodetector 1102 and that for an infrared photodetector according to the principles of the present invention represented by 1101.
Figure 12:
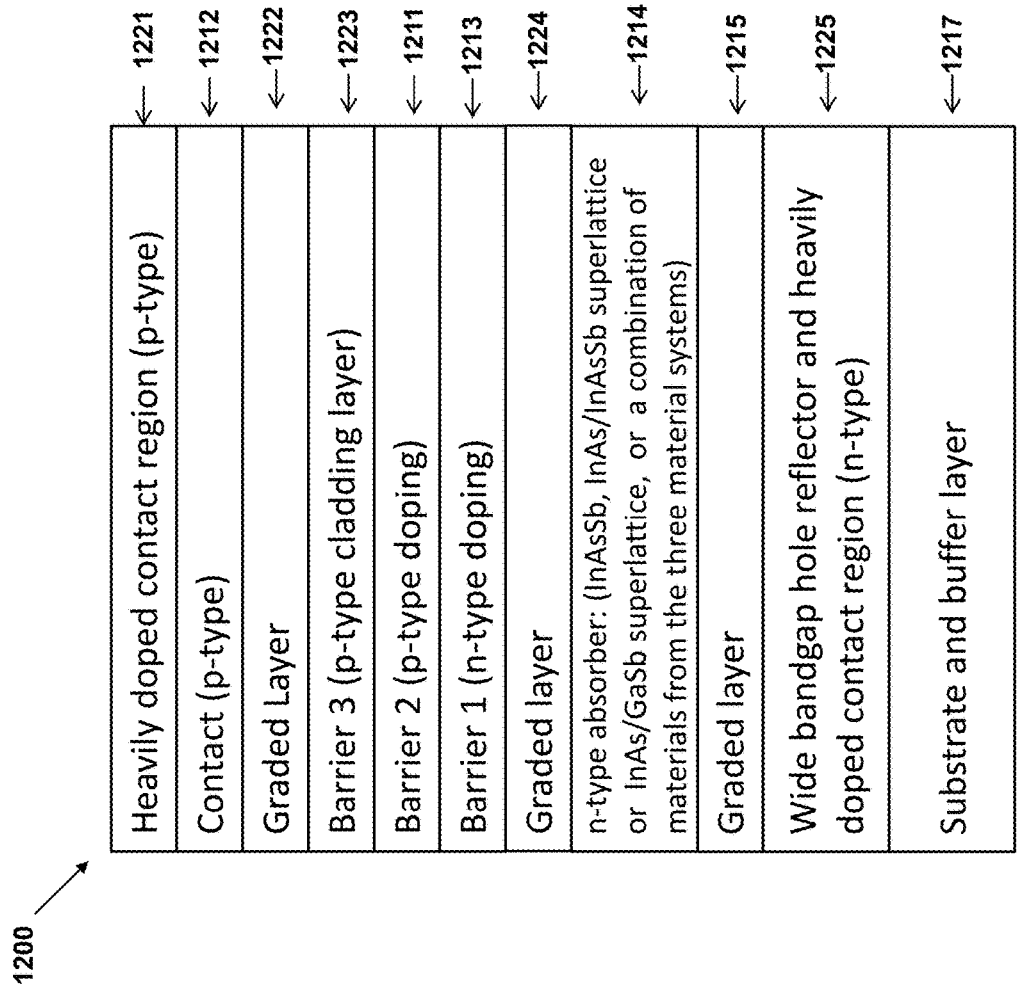
FIG. 12 shows a more detailed structure diagram of the device in FIG. 7.

The corresponding current density vs. voltage characteristics of the detectors with p-type contact 1101 and the prior art n-type contact 1102 are shown in FIG. 11. FIG. 11 shows the I-V characteristics of the p-CB-n device 1101 with zero-volt turn on characteristics. This device represented by 1101 utilized a p-type contact to demonstrate the zero-volt turn-on characteristic. This device (1101) utilized an undoped barrier. Optimization of the doping levels in the barrier can provide further reduction in dark current To achieve improved performance, additional layers can be utilized in the device 1200 structure as illustrated in FIG. 12. This may consist of a third barrier layer 1223 (Barrier3) which can serve as a cladding layer to protect either Barrier2 1211 or both Barrier2 and Barrier1 1213 which may consist of reactive materials such as AlSb-based alloys.

Focal plane arrays that have multiple pixels can be fabricated by shallow etching of the top contact layer and terminating the etch on or within Barrier3 1223 to delineate the pixels. Barrier3 1223 may comprise an aluminum alloy with less than about 75% aluminum, such as AlGaAsSb or AlInAsSb, such that it is less prone to degradation as compared to the Barrrier2 1211 and Barrier 1 1213 compositions which can have higher aluminum contents.

A heavily doped p-type region 1221 that is adjacent the p-type contact layer 1212 can be utilized to achieve good ohmic contacts and lateral conductivity as needed. The contact layers 1212 and 1221 may comprise a wide band gap material as compared to the absorber layer 1214 such that it does not absorb the radiation that is being sensed, and can promote double pass absorption in the absorber layer 1214 (through the use of a metallized surface). Likewise, a heavily doped, n-type contact layer 1225 can be used adjacent the absorber 1214 as well to also reduce the contact resistance and increase lateral conductivity across the focal plane array. This n-type contact layer 1225 can consist of a wide bandgap alloy (as compared to the absorber) such that it transmits the radiation that is being sensed and also serves to reflect the holes (minority carrier) away from the absorber/contact interface. Utilizing wide bandgap contact layers at the top (1221 and 1212, or alternatively 1221 or 1212) and the bottom layer (1225) enable the detector 1200 to accommodate light incidence from the top or the bottom side depending on the detector or read-out integrated circuit integration architecture and the fabrication process.

Continuing with the embodiment illustrated in FIG. 12, the barrier layers 1211 and 1213 form a p-n junction and are capped with a p-type cladding layer 1223. The cladding layer 1223 is topped with the contact layer 1212 and finally a heavily doped contact region 1221. Below the barrier layer 1213 is an optional graded layer 1224 that includes a grading in the alloy composition or the doping level, or both, that acts as a transition to the absorber layer 1214 to minimize any band discontinuities. Below the absorber layer 1214 is another optional graded layer 1215 (graded in alloy composition or doping or both) to provide a smooth transition between the absorber layer 1214 and a wide bandgap hole reflector with a heavily doped contact region 1225. Finally, the wide bandgap hole reflector 1225 is disposed on a substrate 1217 that can include a buffer layer.

Materials for the device 1200 in FIG. 12 include an absorber layer 1214 of InAsSb, InAs/InAsSb superlattices, InAs/GaSb superlattices or substantially, a combination of two or more of these material systems. The barrier layers 1223, 1211 and 1213 may comprise alloys of AlSb, AlGaSb, AlGaAsSb or AlInAsSb. The substrate 1217 may be GaSb or alternatively GaAs, InP, Si and a buffer layer. The remaining layers may comprise various formulations of InAsSb, InAs/InAsSb, or InAs/GaSb. Alternatively, the barriers and the other layers can comprise of InAs/InAsSb superlattices, InAs/GaSb superlattices or substantially, a combination of two or more of these material systems.

In particular the layers 1215, 1224 and 1222 with reference to FIG. 12 may be graded in composition as described in U.S. Pat. No. 7,652,252 issued 26 Jan. 2010 titled "Electronically Tunable and Reconfigurable Hyperspectral Photon Detector", incorporated by reference herein.

Alternatively the layers 1215, 1222 and 1224 with reference to FIG. 12 may be graded in composition using a chirped superlattice as described in IEEE Electron Device Letters, Vol. 17, No. 3, March 1996, p-133, by C. Nguyen, T. Liu, M. Chen, H-C Sun, and D. Rensch, titled "AlInAs/GaInAs/InP double heterojunction bipolar transistors with a novel base-collector design for power applications" incorporated by reference herein.

Figure 16A:
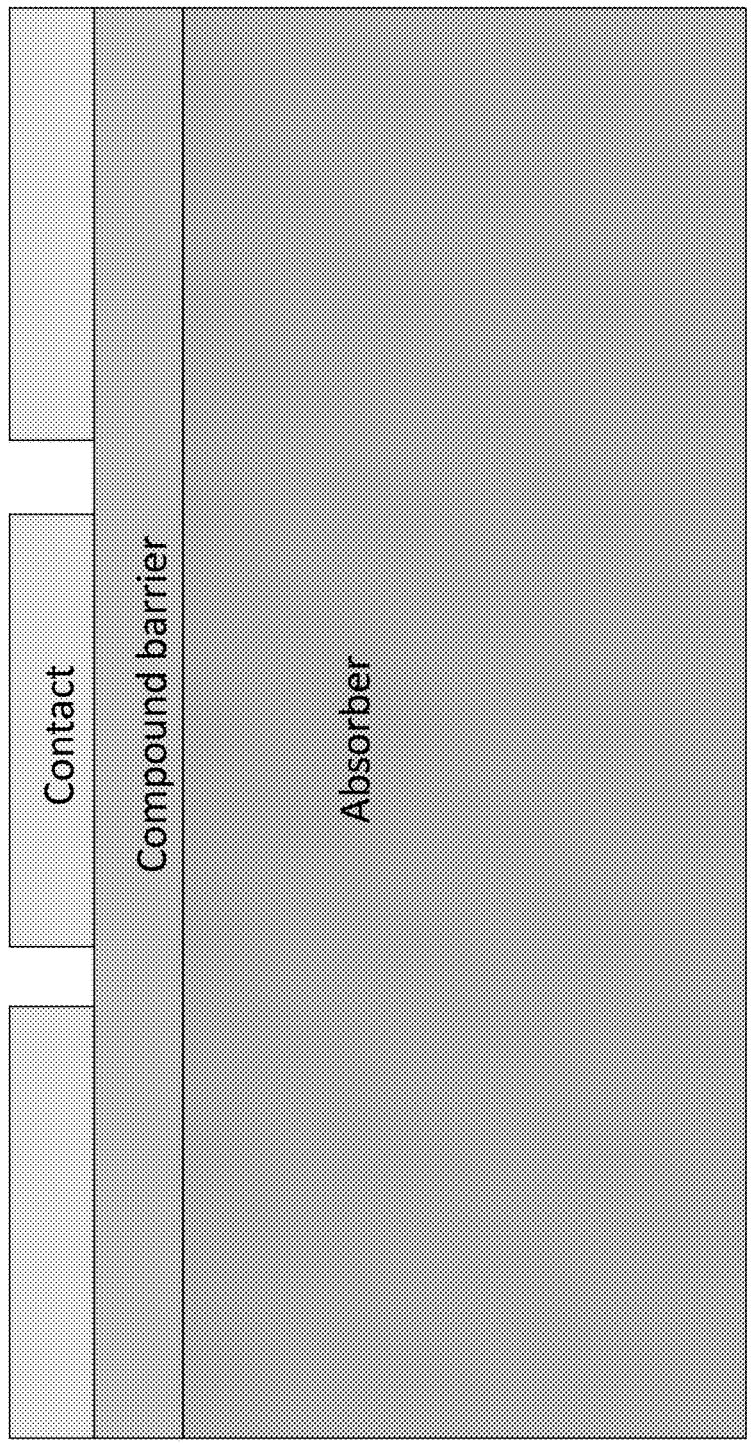
FIG. 16a shows pixel isolation with reticulated contacts obtained by etching the contact layer.

In an array of devices 1200, the array common contact can be made through the contact layer 1212/1221 while the absorber 1214, graded layer 1224 and barrier layers 1213/1211/1223 are reticulated. See FIG. 16e.

FIG. 13 describes exemplary p-CB-n device designs using the InAs/GaSb superlattice based material system with a tungsten based superlattice structure described in E. H. Aifer, J. G. Tischler, J. H. Warner, I. Vurgaftman, W. W. Bewley, J. R. Meyer, J. C. Kim, and L. J. Whitman, Applied Physics Letters, 89, 053519 (2006), incorporated by reference herein in its entirety. The composition is per the principles of the present invention with the superlattice structure per the Aifer reference for Tungsten. The nomenclature 9 ML InAs/7 ML GaSb refers to the number of mono-layers (ML) of InAs and GaSb used repetitively to build up the specified layer thickness. For n-CB-p design 1 in FIG. 13, the p-Absorber comprises superlattice layers built up to 5 microns thick, each superlattice layer comprises nine mono-layers of InAs and seven mono-layers of GaSb. Other structures are known to those skilled in the art and the specification in FIG. 13 is not meant to imply a limitation.

Without implying a limitation, FIG. 14 describes exemplary p-CB-n device designs using the InAs/InAsSb superlattice based material system.

Without implying a limitation, FIG. 15 describes exemplary p-CB-n device designs using the InAsSb based material system The ability to controllably dope the barrier layer is critical for control of the electric field in the absorber layer of the device. With proper selection of the barrier doping, the electric field in the absorber layer can be minimized, which eliminates substantially all generation-recombination current contribution to the dark current. Specifically, the absorber layer in the vicinity of the barrier layer preferably has a low electric field strength to minimize depletion of the absorber layer. Preferably the electric field strength is less than about 10 V/cm. Depletion of the absorber layer can result in increased dark current (generation-recombination current)

Figure 16B:
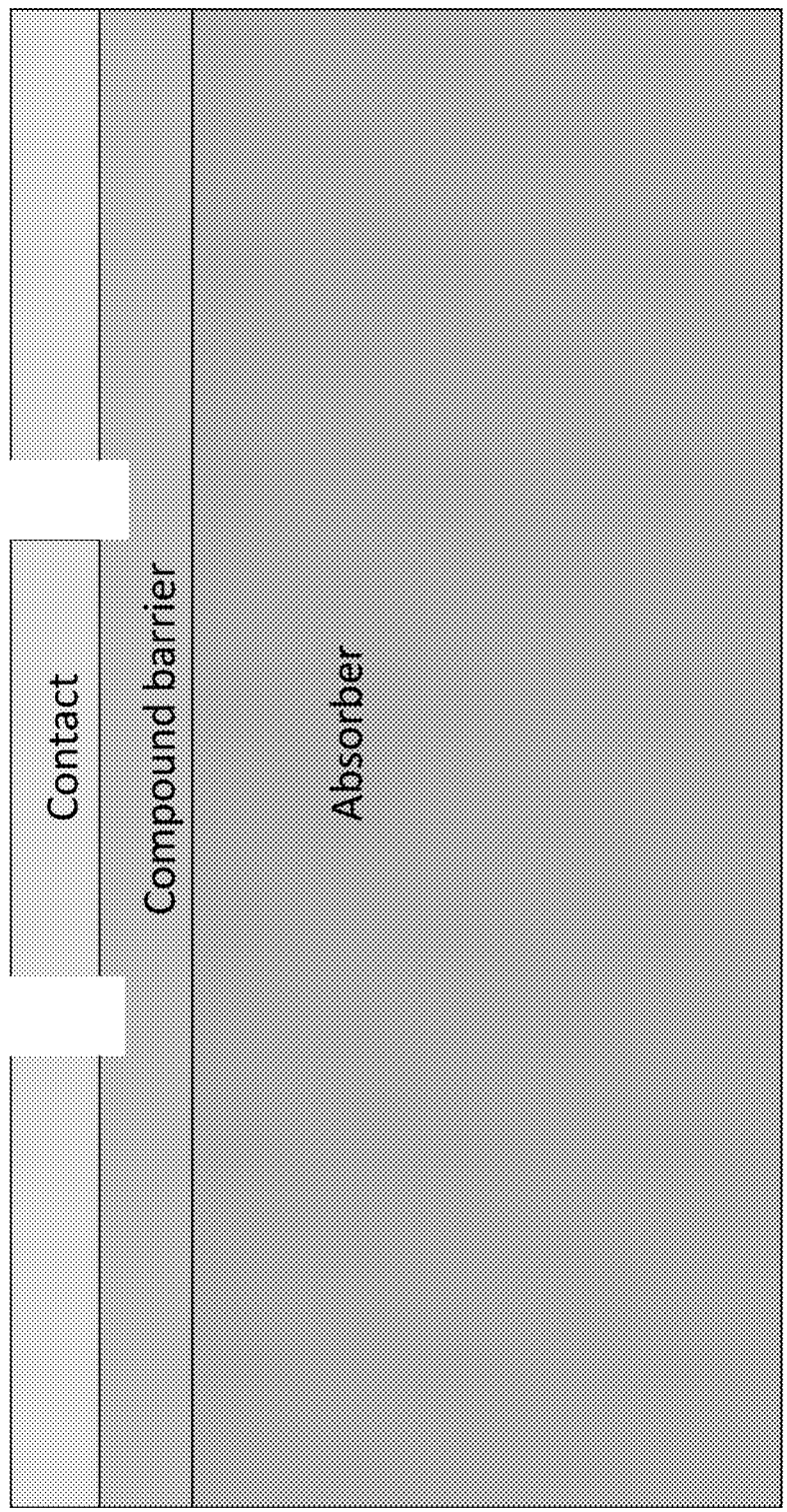
FIG. 16b shows pixel isolation with reticulated contacts obtained by etching the contact layer and a portion of the barrier layer.
Figure 16C:
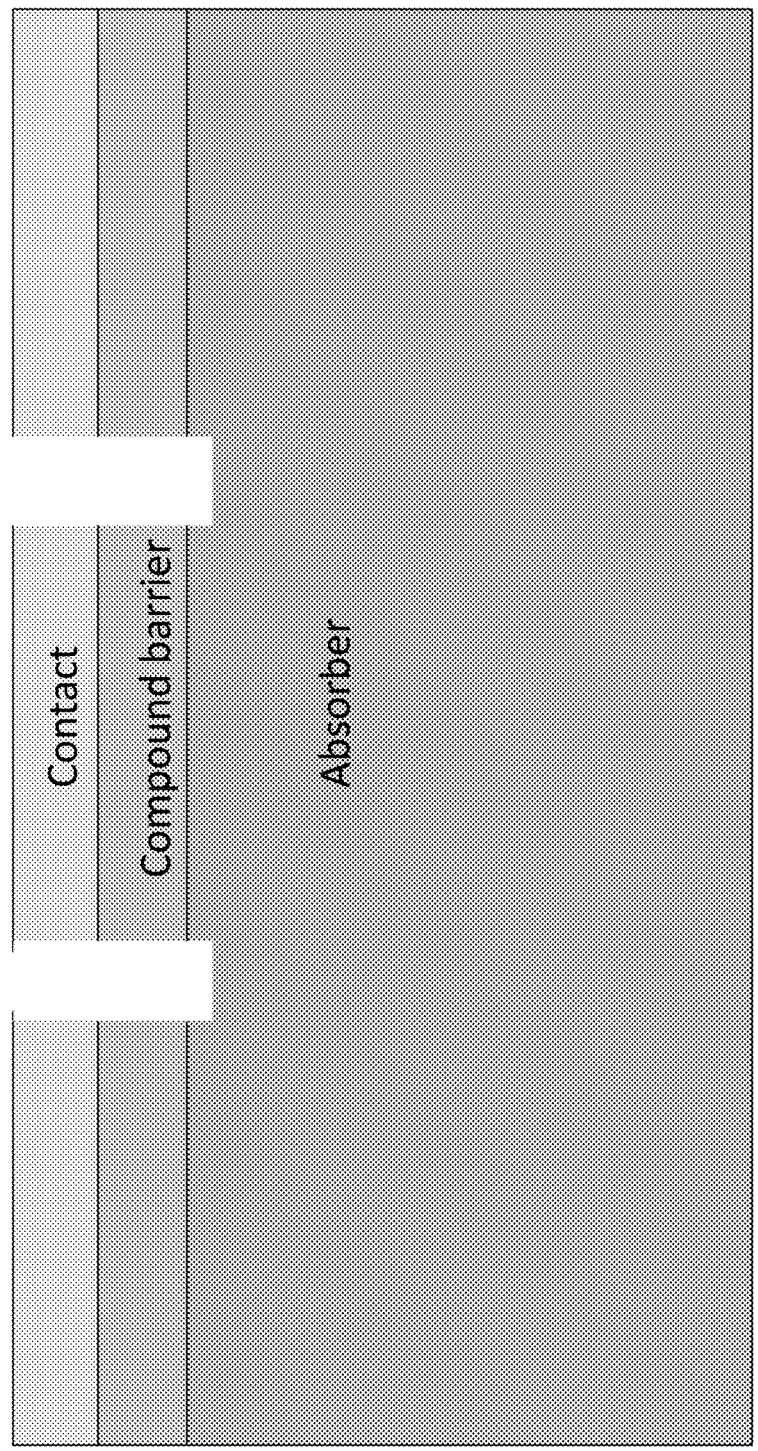
FIG. 16c shows pixel isolation with reticulated contacts obtained by etching the contact layer and the entire barrier layer.
Figure 16D:
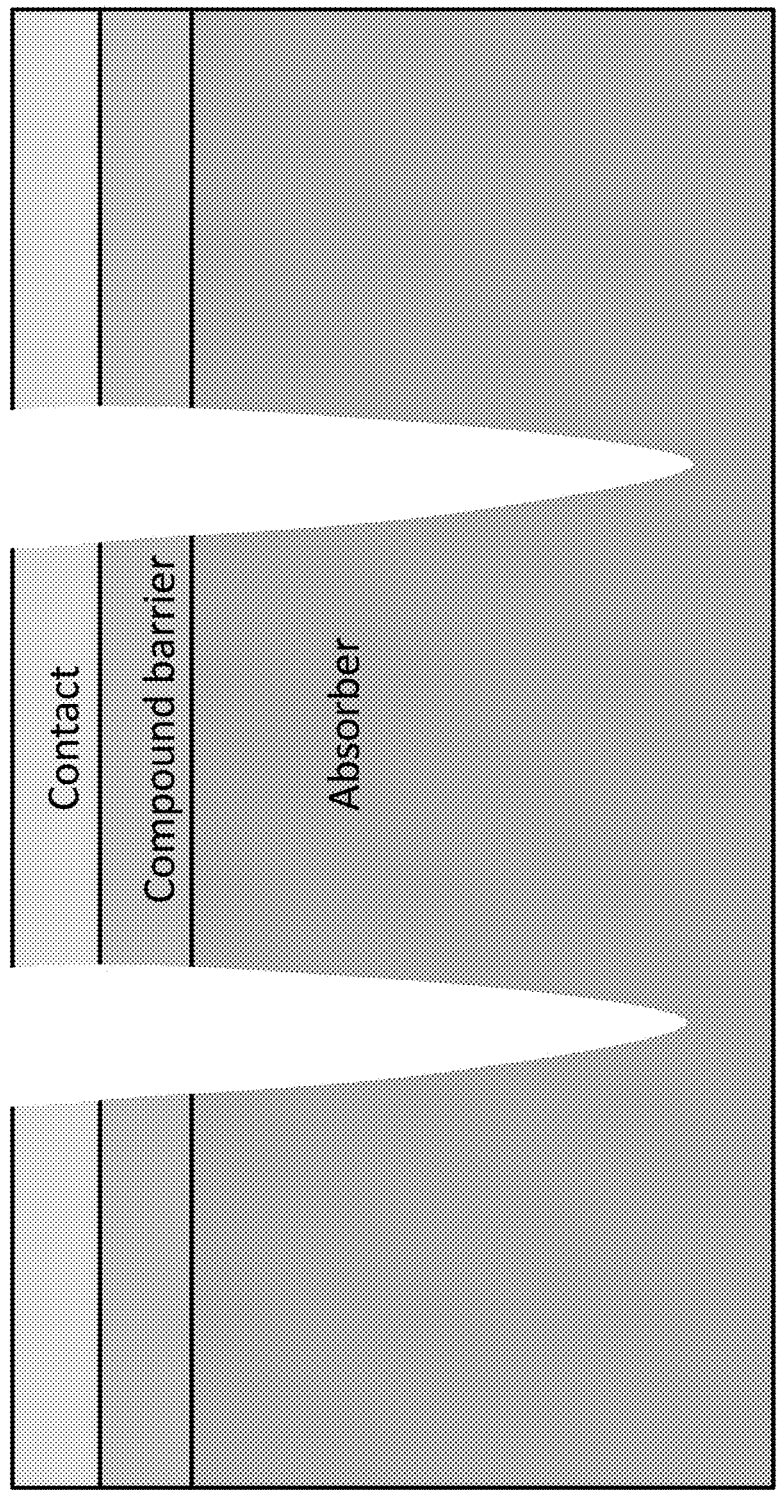
FIG. 16d shows pixel isolation with reticulated contacts obtained by etching the contact layer the entire barrier as well as reticulation of the absorber to minimize cross talk.

Without implying a limitation, a typical techniques to fabricate the infrared photodetector devices 700 and 1200 includes Molecular Beam Epitaxy and metallorganic chemical vapor deposition. The fabrication of a detector array can be accomplished by delineating individual pixels. This can be accomplished in many ways. Pixel delineation can be achieved by a shallow etch that etches the contact layer (FIG. 16a), a portion of the barrier (FIG. 16b) or the entire barrier (FIG. 16c). Alternatively, the pixel delineation can consist of a deeper etch that isolates the contact layer, barrier layer as well as a significant portion of the absorber layer, from the neighboring pixels in order to minimize pixel-to-pixel cross talk (FIG. 16d). The etching can be accomplished using a wet-etch or accomplished through a dry etch process, or alternatively a combination of dry and wet etch processes. The etched sidewall can be passivated using a dielectric such as ($Si_3N_4$, $Al_2O_3$ or $SiO_2$) or a polymer such as polyimide. The array common contact is made though the absorber, or the contact layer 1225 of FIG. 12, portions of which are continuous across the entire array and contact to the isolated diodes is made through the individual pixel contact layer 1221 of FIG. 12.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A photodetector structure comprising:
   a compound barrier layer disposed on an absorber layer;
   a first contact layer disposed on the absorber layer opposite the compound barrier layer,
   the compound barrier comprising:
   a first barrier layer comprising a first material having a first doping type disposed on the absorber layer,
   a second barrier layer comprising the first material having a second doping type disposed on the first barrier layer;
   wherein the absorber layer has the first doping type;
   the first doping type is opposite the second doping type; and
   wherein the first barrier layer and second barrier layer have a same doping level such that the first and second barrier layers of opposite conductivity types introduce a p-n junction in the compound barrier to minimize band bending in the absorber layer.

2. The photodetector of claim 1, wherein the absorber layer comprises a III-V semiconductor material.

3. The photodetector of claim 1, further comprising a second contact layer disposed on the second barrier layer.

4. The photodetector of claim 1, further comprising a second contact layer doped the second doping type disposed on the second barrier layer.

5. The photodetector of claim 3, wherein the second contact layer has a band gap equal to or greater than that of the absorber layer.

6. The photodetector of claim', wherein a substrate is disposed on the first contact layer opposite the absorber layer.

7. The photodetector of claim 6, wherein the substrate is GaAs.

8. A photodetector structure comprising:
   a buffer layer disposed on a substrate;
   a first contact layer with a first contact layer doping type disposed on the buffer layer;
   an absorber layer with an absorber layer doping type disposed on the first contact layer, wherein the first contact layer doping type is same as the absorber layer doping type and a first contact layer band gap is equal to or larger than an absorber layer band gap;
   a compound barrier layer disposed on the absorber layer; wherein the compound barrier layer has a band gap greater than the band gap of the absorber layer and comprising:
   a first barrier layer comprising a first material with a first barrier layer doping type disposed on the absorber layer, the first barrier layer doping type is the same as the absorber layer doping type;
   a second barrier layer comprising the first material with a second barrier layer doping type disposed on the first barrier layer wherein the second barrier layer doping type is opposite the first barrier layer doping type;
   wherein the first barrier layer and the second barrier layer have a same doping level such that the first barrier layer and second barrier layer of opposite conductivity types introduces a p-n junction in the compound barrier to minimize band bending in the absorber layer;
   a cladding layer disposed on the second barrier layer.

9. The photodetector of claim 8, further comprising a second contact layer with a second contact layer doping type opposite the absorber layer doping type disposed on the cladding layer.

10. The photodetector of claim 1, wherein the first material comprises AlGaSb, $AlAs_xSb_{1-x}$, $AlGa_xSb_{1-x}$, AlInAsSb, or AlGaAsSb.

11. The photodetector of claim 8, wherein the first material comprises a superlattice of InAs/GaInSb/AlGaSb.

12. The photodetector of claim 8, wherein the first material comprises $AlAs_xSb_{1-x}$, $AlGa_xSb_{1-x}$, AlInAsSb, or AlGaAsSb.

13. The photodetector of claim 8, wherein:
   the first barrier layer is graded in composition; and
   the second barrier layer is graded in composition.

14. The photodetector of claim 8, wherein:
   the first contact layer and the compound barrier layer comprise antimony and one or more of the following: Al, Ga, In, As or N.

15. The photodetector of claim 8, wherein:
   at least one of the absorber layer, the first contact layer; or the compound barrier layer comprises a binary alloy, a ternary alloy, or a quaternary alloy.

16. The photodetector of claim 1, wherein the first material is a superlattice of In As/GaInSb/AlGaInSb.

17. The photodetector of claim 1, wherein the first material comprises a plurality of alternating monolayers of InAs and GaSb.

18. The photodetector of claim 8, wherein:
the first barrier layer is graded in doping level; and
the second barrier layer is graded in doping level.

19. The photodetector of claim 1, wherein:
the first barrier layer is graded in composition; and
the second barrier layer is graded in composition.

* * * * *